United States Patent
Wood et al.

(10) Patent No.: US 9,673,071 B2
(45) Date of Patent: Jun. 6, 2017

(54) BUFFER STATION FOR THERMAL CONTROL OF SEMICONDUCTOR SUBSTRATES TRANSFERRED THERETHROUGH AND METHOD OF TRANSFERRING SEMICONDUCTOR SUBSTRATES

(71) Applicant: Lam Research Corporation, Fremont, CA (US)

(72) Inventors: Keith Freeman Wood, Sunnyvale, CA (US); Matthew Jonathon Rodnick, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 295 days.

(21) Appl. No.: 14/522,338

(22) Filed: Oct. 23, 2014

(65) Prior Publication Data
US 2016/0118280 A1    Apr. 28, 2016

(51) Int. Cl.
| B64D 13/04 | (2006.01) |
| B64D 13/08 | (2006.01) |
| H01L 21/67 | (2006.01) |
| H01L 21/677 | (2006.01) |

(52) U.S. Cl.
CPC .... *H01L 21/67109* (2013.01); *H01L 21/6719* (2013.01); *H01L 21/67769* (2013.01)

(58) Field of Classification Search
CPC .......... H01L 21/67109; H01L 21/6719; H01L 21/67769
USPC .......... 165/234, 201, 200, 205, 206; 34/523, 34/524, 549; 414/935, 936, 937, 939, 414/940, 222.01–226.05, 147–216
See application file for complete search history.

(56) References Cited

U.S. PATENT DOCUMENTS

| 4,917,556 | A | | 4/1990 | Stark et al. |
| 5,186,718 | A | * | 2/1993 | Tepman ............ H01L 21/67167 148/DIG. 169 |
| 5,509,771 | A | * | 4/1996 | Hiroki ...................... B65H 1/00 414/217 |
| 5,609,698 | A | | 3/1997 | Kato et al. |
| 6,092,981 | A | * | 7/2000 | Pfeiffer ............. H01L 21/67303 206/710 |

(Continued)

FOREIGN PATENT DOCUMENTS

EP     1684951 B1    5/2014

*Primary Examiner* — Justin Jonaitis (57) ABSTRACT

A buffer station for thermal control of semiconductor substrates in a semiconductor substrate processing system is configured to interface with first and second vacuum transfer modules of the system so as to allow substrates to be transferred therebetween. The buffer station comprises a first vacuum transfer module interface configured to allow substrates to be transferred between the first vacuum transfer module and the buffer station, and a second transfer module interface configured to allow substrates to be transferred between the second vacuum transfer module and the buffer station. At least one buffer chamber between the first and second vacuum transfer module interfaces includes a lower pedestal configured to receive a substrate on a support surface thereof. One or more semiconductor substrate storage shelves are above the lower pedestal. Each shelf is configured to receive a substrate from the first or second vacuum transfer module and store the respective substrate thereon.

25 Claims, 7 Drawing Sheets

(56) References Cited

U.S. PATENT DOCUMENTS

| | | | |
|---|---|---|---|
| 6,257,827 B1* | 7/2001 | Hendrickson | H01L 21/67201 414/217 |
| 6,543,981 B1 | 4/2003 | Halsey et al. | |
| 6,567,258 B2 | 5/2003 | Sexton et al. | |
| 6,920,915 B1* | 7/2005 | Shih | H01L 21/67109 118/724 |
| 7,025,554 B2 | 4/2006 | Ozawa et al. | |
| 7,153,388 B2 | 12/2006 | Parks | |
| 7,309,618 B2 | 12/2007 | Gotkis et al. | |
| 7,536,538 B1 | 5/2009 | Huang et al. | |
| 7,560,007 B2 | 7/2009 | Gaff | |
| 7,604,449 B1 | 10/2009 | Kaveh | |
| 7,680,559 B2 | 3/2010 | Thorgrimsson | |
| 7,682,462 B2 | 3/2010 | Kroeker | |
| 7,798,388 B2 | 9/2010 | Crockett et al. | |
| 8,033,769 B2 | 10/2011 | Gage et al. | |
| 8,185,242 B2 | 5/2012 | Wong et al. | |
| 8,192,131 B1 | 6/2012 | Stevens et al. | |
| 8,197,177 B2 | 6/2012 | van der Meulen et al. | |
| 8,225,683 B2 | 7/2012 | Bailey, III | |
| 8,282,698 B2 | 10/2012 | Lenz | |
| 8,430,620 B1 | 4/2013 | Blank | |
| 8,489,237 B2 | 7/2013 | Gage et al. | |
| 8,491,248 B2 | 7/2013 | Gage et al. | |
| 8,562,272 B2 | 10/2013 | Lenz | |
| 8,616,821 B2 | 12/2013 | Ku et al. | |
| 8,639,381 B2 | 1/2014 | Thorgrimsson | |
| 8,680,441 B2 | 3/2014 | Singh | |
| 8,696,298 B2* | 4/2014 | van der Meulen | H01L 21/6719 414/805 |
| 8,757,177 B2 | 6/2014 | Kholodenko et al. | |
| 8,851,817 B2 | 10/2014 | Bonora et al. | |
| 2003/0131458 A1* | 7/2003 | Wang | H01L 21/67167 29/25.01 |
| 2003/0192686 A1* | 10/2003 | Hisai | F28D 15/02 165/201 |
| 2004/0238122 A1* | 12/2004 | Ishizawa | H01L 21/67109 156/345.31 |
| 2005/0111938 A1* | 5/2005 | van der Meulen | H01L 21/67167 414/217 |
| 2006/0021575 A1* | 2/2006 | Ishizawa | H01L 21/67167 118/719 |
| 2008/0014055 A1* | 1/2008 | van der Meulen | B65G 25/02 414/173 |
| 2008/0232934 A1 | 9/2008 | Price et al. | |
| 2012/0328780 A1 | 12/2012 | Yamagishi | |
| 2014/0072397 A1 | 3/2014 | Mooring | |
| 2014/0076234 A1 | 3/2014 | Kao et al. | |
| 2014/0086720 A1 | 3/2014 | Kao et al. | |
| 2014/0112743 A1 | 4/2014 | Morisawa | |
| 2014/0119858 A1 | 5/2014 | Koike et al. | |
| 2014/0161570 A1 | 6/2014 | Hofmeister et al. | |
| 2014/0174354 A1 | 6/2014 | Arai | |
| 2014/0178160 A1 | 6/2014 | Fosnight et al. | |
| 2014/0199138 A1 | 7/2014 | van der Meulen et al. | |

\* cited by examiner

BUFFER STATION FOR THERMAL CONTROL OF SEMICONDUCTOR SUBSTRATES TRANSFERRED THERETHROUGH AND METHOD OF TRANSFERRING SEMICONDUCTOR SUBSTRATES

FIELD

This disclosure relates to a buffer stations, and more particularly, a buffer station for thermal control of semiconductor substrates being transferred therethrough between vacuum transfer modules of a modular semiconductor substrate processing system.

BACKGROUND

Different types of tools are used to perform hundreds of processing operations during processing of semiconductor substrates (i.e. wafers) in semiconductor substrate processing systems. Most of these operations are performed in vacuum chambers (i.e., process chambers) of a semiconductor substrate processing system at very low pressure. Other operations are performed at atmospheric pressure in controlled environments of filtered air or an inert gas. Semiconductor substrates are introduced to the process chambers with semiconductor substrate handling systems that are mechanically coupled to respective process chambers. The semiconductor substrate handling systems transfer substrates from the factory floor to the process chamber.

Semiconductor substrate handling systems can include, for example, equipment front end modules (EFEMs) which are operable to transfer substrates from a front opening unified pod (FOUP) to the semiconductor substrate processing system for processing and back to the FOUP, load locks to bring the semiconductor substrates from atmospheric conditions to very low pressure conditions (e.g., vacuum conditions) and back to atmospheric conditions, and vacuum transfer modules operable to transfer semiconductor substrates to and from semiconductor substrate the load locks and semiconductor substrate processing modules in operational relationship with the vacuum transfer modules. The semiconductor substrate handling systems can include robots to transfer the substrates to various positions in the semiconductor substrate processing system. Throughput (i.e., the number of substrates that are processed in a period of time) is affected by the substrate processing time, the number of substrates that are processed at a given time, as well as timing of the steps to introduce the substrates into the vacuum chambers. Thus, improved methods and apparatuses which increase throughput are needed.

SUMMARY

Disclosed herein is a buffer station for thermal control of semiconductor substrates in a modular semiconductor substrate processing system being transferred therethrough. The buffer station is configured to interface with first and second vacuum transfer modules of the modular semiconductor substrate processing system so as to allow semiconductor substrates to be transferred therebetween. The buffer station comprises a first vacuum transfer module interface configured to allow one or more semiconductor substrates to be transferred between the first vacuum transfer module and the buffer station at vacuum pressure. A second vacuum transfer module interface is configured to allow one or more semiconductor substrates to be transferred between the second vacuum transfer module and the buffer station at vacuum pressure. At least one buffer chamber between the first vacuum transfer module interface and the second vacuum transfer module interface includes a lower pedestal configured to receive a semiconductor substrate from the first vacuum transfer module or the second vacuum transfer module on a support surface thereof. The lower pedestal is operable to perform a heating or cooling operation on the semiconductor substrate received thereon. One or more semiconductor substrate storage shelves are above the lower pedestal which are each configured to receive a semiconductor substrate from the first vacuum transfer module or the second vacuum transfer module wherein each semiconductor substrate storage shelf is operable to store a respective semiconductor substrate thereon.

Also disclosed herein is a modular semiconductor substrate processing system including a buffer station for thermal control of semiconductor substrates being transferred therethrough. The modular semiconductor substrate processing system comprises a first vacuum transfer module, a second vacuum transfer module, and a buffer station interfaced with the first vacuum transfer module and the second vacuum transfer module so as to allow semiconductor substrates to be transferred therebetween. The buffer station comprises a first vacuum transfer module interface operable to allow one or more semiconductor substrates to be transferred between the first vacuum transfer module and the buffer station at vacuum pressure, and a second vacuum transfer module interface operable to allow one or more semiconductor substrates to be transferred between the second vacuum transfer module and the buffer station at vacuum pressure. At least one buffer chamber between the first vacuum transfer module interface and the second vacuum transfer module interface includes a lower pedestal operable to receive a semiconductor substrate from the first vacuum transfer module or the second vacuum transfer module on a support surface thereof. The lower pedestal is operable to perform a heating or cooling operation on the semiconductor substrate received thereon. One or more semiconductor substrate storage shelves are above the lower pedestal which are each operable to receive a semiconductor substrate from the first vacuum transfer module or the second vacuum transfer module wherein each semiconductor substrate storage shelf is operable to store a respective semiconductor substrate thereon.

Additionally disclosed herein is a method of transferring semiconductor substrates through a buffer station between a first vacuum transfer module and a second vacuum transfer module of a modular semiconductor substrate processing system. The method comprises transferring a semiconductor substrate from a first vacuum transfer module through a first vacuum transfer module interface into a first buffer chamber of the buffer station. The semiconductor substrate is supported on a support surface of a lower pedestal disposed in the first buffer chamber wherein a heating or cooling operation is performed on the semiconductor substrate supported on the support surface of the lower pedestal. The semiconductor substrate is transferred from the lower pedestal of the first buffer chamber through a second vacuum transfer module interface of the buffer station to a second vacuum transfer module.

DETAILED DESCRIPTION

In the following detailed disclosure, exemplary embodiments are set forth in order to provide an understanding of the apparatus and methods disclosed herein. However, as will be apparent to those skilled in the art, that the exemplary embodiments may be practiced without these specific details or by using alternate elements or processes. In other instances, well-known processes, procedures, and/or components have not been described in detail so as not to unnecessarily obscure aspects of embodiments disclosed herein.

Figure 1A:
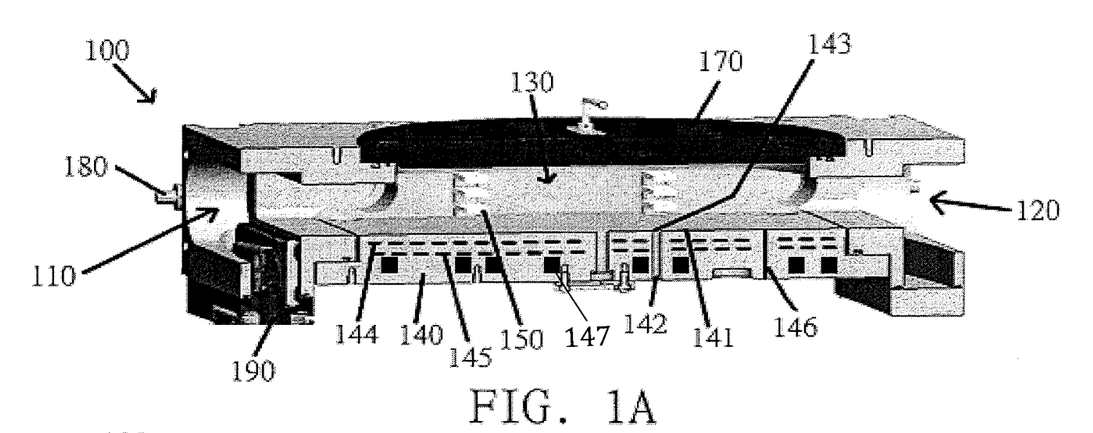
FIGS. 1A and 1B illustrate cross sections of a buffer station according to embodiments as disclosed herein.
Figure 1B:
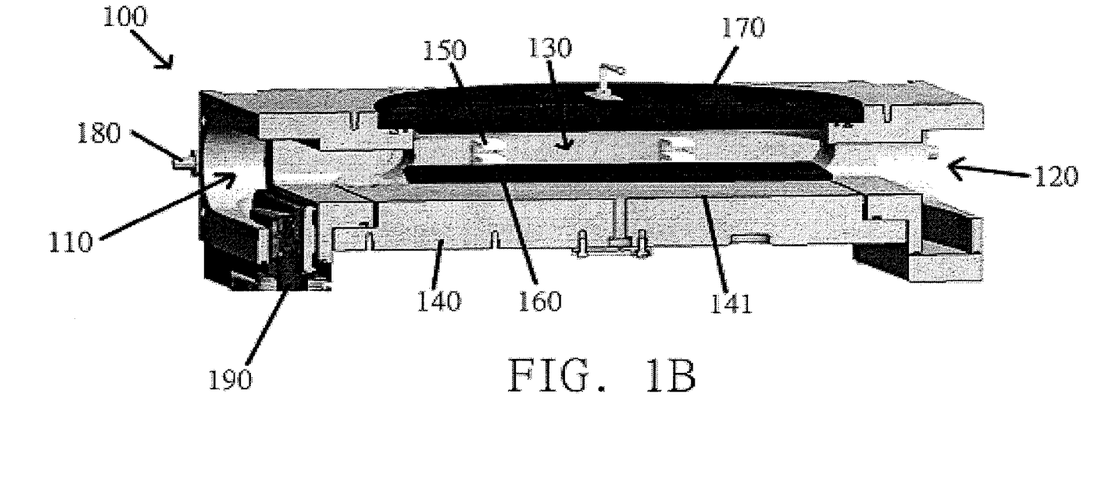

FIGS. 1A and 1B each illustrate a cross section of a buffer station 100 for thermal control of semiconductor substrates being passed therethrough between semiconductor substrate handling systems, such as vacuum transfer modules, according to embodiments disclosed herein. The buffer station 100 comprises a first vacuum transfer module interface 110 operable to allow one or more semiconductor substrates to be transferred therethrough and a second vacuum transfer module interface 120 operable to allow one or more semiconductor substrates to be transferred therethrough. The buffer station includes at least one buffer chamber, such as buffer chamber 130 between the first transfer module interface 110 and the second transfer module interface 120. The buffer chamber 130 includes a lower pedestal 140 operable to receive a semiconductor substrate on a support surface 141 thereof. The lower pedestal 140 is operable to heat or cool a semiconductor substrate supported on the support surface 141 thereof. The support surface 141 defines a lower surface of the buffer chamber 130 wherein a lower surface of a lid 170 can define an upper surface of the buffer chamber 130.

The buffer chamber 130 can include one or more semiconductor substrate storage shelve's 150 above the lower pedestal 140 wherein each semiconductor substrate storage shelf 130 is operable to store a respective semiconductor substrate thereon. For example, as illustrated in FIG. 1A, the buffer chamber 130 includes three semiconductor substrate storage shelves 150. In alternate embodiments, the buffer chamber 130 can include 2, 4, 5, or more semiconductor substrate storage shelves 150. Preferably, as illustrated in FIG. 1B, the buffer chamber 130 includes a heat shield 160 between the lower pedestal 140 and the one or more semiconductor substrate storage shelves 150. The heat shield 160 can be formed from a thermally insulating material, and is operable to reduce heat transfer between a semiconductor substrate supported on the lower pedestal 140 and one or more substrates supported on the respective one or more semiconductor substrate storage shelves 150.

Figure 2:
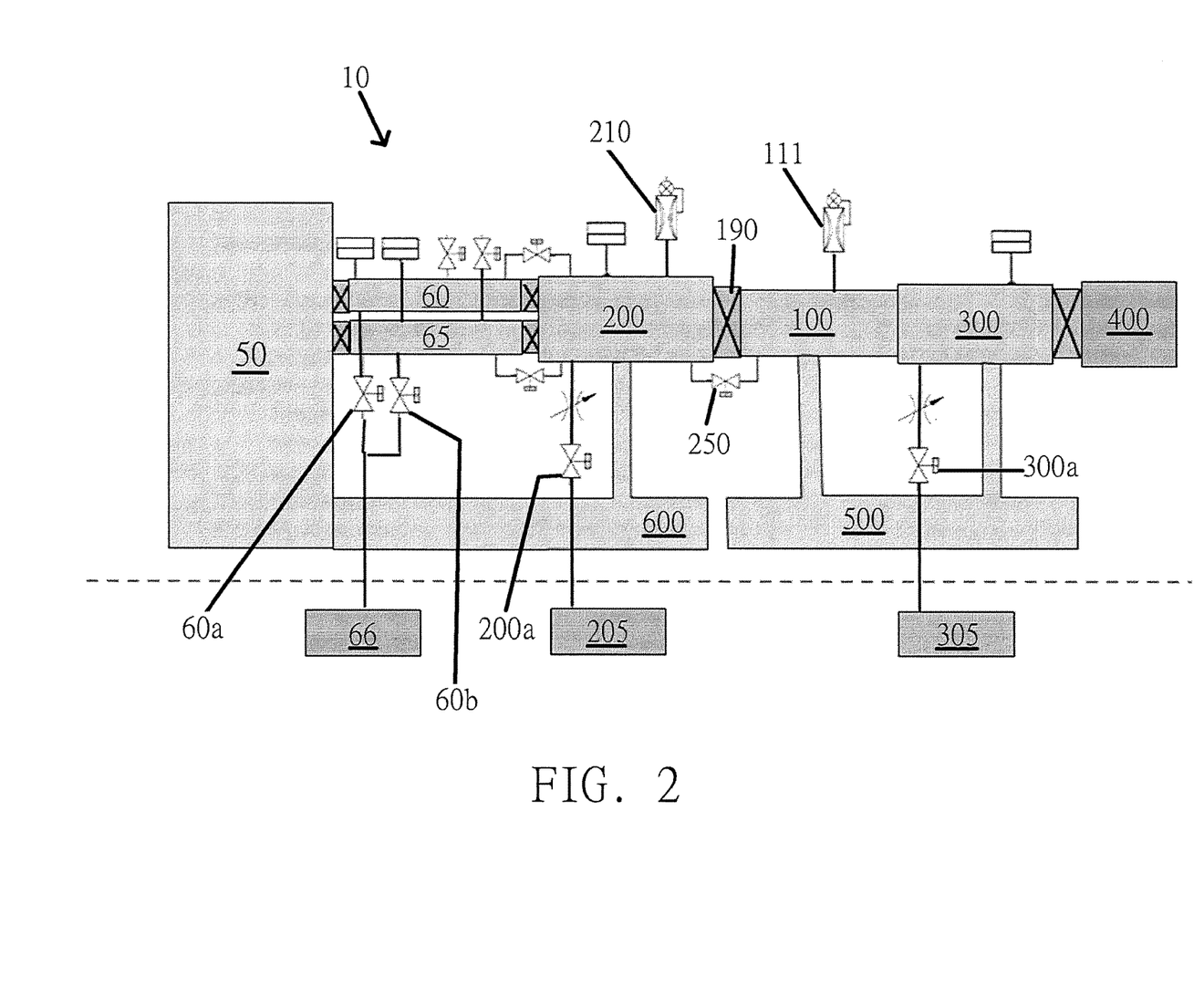
FIG. 2 illustrates a block diagram of a modular semiconductor substrate processing system including a buffer station according to embodiments disclosed herein.

Referring to FIG. 2, the buffer station 100 is preferably in operational relationship with two or more semiconductor substrate handling systems operable to transfer semiconductor substrates therethrough. For example, first and second vacuum transfer modules 200, 300 may each include a respective robot operable to place a semiconductor substrate on the lower pedestal 140 of the buffer station 100 and remove the semiconductor substrate from the lower pedestal 140. The respective robots may also be operable to place a semiconductor substrate on a storage shelf 130 of the buffer station 100 and remove the semiconductor substrate therefrom. In an embodiment, the robot of the first vacuum transfer module 200 is operable to place a semiconductor substrate on the lower pedestal 140 and one or more semiconductor substrates on respective storage shelves 130. After the semiconductor substrate on the lower pedestal 140 has undergone a heating or cooling operation (or other process operation such as an in situ metrology process or wafer cleaning process), the robot of the second vacuum transfer module 300 may remove the semiconductor substrate from the lower pedestal 140 and transfer the semiconductor substrate to a processing module 400 in operational relationship therewith wherein the robot of the second vacuum transfer module 300, or alternatively the robot of the first vacuum transfer module 200, may then transfer a semiconductor substrate from one of the respective storage shelves 130 to the lower pedestal 140 wherein a heating or cooling operation may then be performed on the semiconductor substrate.

In a further embodiment, the a semiconductor substrate may be placed on a storage shelf 130 by the robot of the first vacuum transfer module 200 and removed from the storage shelf 130 by the robot of the second vacuum transfer module 300 without being placed on the lower pedestal 140 for processing, or vice versa. In a further embodiment, semiconductor substrates which may have broken during processing may be placed and stored on a semiconductor substrate storage shelf 130 so as not to interfere with the throughput of a batch of semiconductor substrates being processed in the semiconductor substrate processing system 10. Thus, embodiments of a buffer station 100 disclosed herein can increase semiconductor substrate throughput through a semiconductor substrate processing system 10 by performing a process operation on the semiconductor substrate during transfer, by allowing one or more semiconductor substrates to be stored therein allowing for quicker access to semiconductor substrates being transferred through the buffer station 100, and allowing for broken substrates to be removed from the processing line without having to take the time to remove the broken semiconductor substrate or interrupting the processing of the remaining semiconductor substrates.

Referring back to FIG. 1A, the lower pedestal 140 of the buffer station 100 can include at least one outlet 143 in the support surface 141 which can deliver a heat transfer gas to an underside of a semiconductor substrate supported thereon, and at least one gas passage 142 extending through the lower pedestal 140 connected to a source of heat transfer gas (not shown) operable to supply heat transfer gas at a desired pressure to the at least one gas passage 142. In an embodiment, the lower pedestal 140 can include a monopolar or bipoloar electrostatic clamping (ESC) electrode 144. The ESC electrode is operable to apply an electrostatic clamping force to a semiconductor substrate on the support surface 141 when an electrostatic clamping voltage is applied to the monopolar or bipolar ESC electrode 144. The lower pedestal 140 can also include lift pins 146 operable to lower a semiconductor substrate onto the support surface 141 of the lower pedestal 140 and to raise the semiconductor substrate from the support surface 141 of the lower pedestal 140. An exemplary embodiment of a pedestal including an ESC electrode and lift pins which are operable to lower and raise a semiconductor substrate can be found in commonly-assigned U.S. Pat. No. 6,567,258, which is hereby incorporated by reference herein in its entirety.

The lower pedestal 140 further includes a heater layer 145 which includes independently controllable heater zones operable to independently control and tune the spatial and temporal temperature of the support surface 141 and thereby a semiconductor substrate supported on the support surface 141 of the lower pedestal 140. The lower pedestal 140 can also include a cooling layer 147, such as a fluid-cooled heat sink operable to reduce the temperature of the lower pedestal 140 and thereby a semiconductor substrate supported on a support surface thereof. An exemplary embodiment of a pedestal including a heater layer 145 and cooling layer can be found in commonly-assigned U.S. Pat. No. 8,680,441, which is hereby incorporated by reference herein in its entirety.

The buffer station 100 is configured to interface with first and second vacuum transfer modules of the modular semiconductor substrate processing system so as to allow semiconductor substrates to be transferred therebetween. Preferably, the buffer station 100 includes a first slit valve 190 at the first vacuum transfer module interface 110 configured to isolate the environment of the buffer chamber 130, and/or a second slit valve (not shown) at the second vacuum transfer module interface 120 configured to isolate the environment of the buffer chamber 130. The first slit valve 190 and the optional second slit valve can be raised to thereby isolate the environment of the buffer chamber 130. In a further embodiment, the buffer station 100 need not include either a first or second slit valve. In an embodiment, the buffer station 100 can include alignment pins 180 so as to allow the first and second vacuum transfer module interface 110, 120 to align with respective ports of semiconductor substrate handling systems interfaced therewith. For example, the buffer station 100 includes alignment pins 180 operable to align a first port 110 of the first vacuum transfer module interface 110 with a respective port of the first vacuum transfer module (not shown), and alignment pins 180 operable to align a first port 120a of the second vacuum transfer module interface 120 with a respective port of the second vacuum transfer module (not shown).

For example, FIG. 2 illustrates a block diagram of a modular semiconductor substrate processing system 10 including semiconductor substrate handling systems and a buffer station 100 according to embodiments disclosed herein. As shown in FIG. 2, the modular semiconductor substrate processing system 10 includes an EFEM 50 which is in operational relationship with a first vacuum transfer module 200 via an upper load lock 60 and a lower load lock 65. The EFEM 50 includes a controlled environment therein such as an environment of filtered air (e.g. ambient filtered air) or an environment of an inert gas such as nitrogen wherein the controlled environment can be at atmospheric pressure or at a pressure greater or lesser than atmospheric pressure such as vacuum pressure.

The EFEM 50 includes one or more substrate load ports (not shown) wherein each substrate load port is adapted to receive a front opening unified pod (FOUP) from, for example, an overhead substrate transfer system (not shown) operable to transfer a FOUP to a respective substrate load port such that one or more robots in the EFEM 50 can unload and load semiconductor substrates from the FOUP. The FOUP is a type of plastic enclosure designed to hold semiconductor substrates (e.g., generally silicon wafers (Si) but may also include various other substrate types formed from elemental semiconductor materials such as germanium (Ge), or compound semiconductor materials such as gallium-arsenide (GaAs) or indium arsenide (InAs)). The FOUP holds the substrates (not shown) securely and safely in a controlled environment thereof. In an embodiment, the controlled environment of the EFEM 50 can be at vacuum pressure wherein the FOUP attached to the substrate load port is likewise under vacuum pressure.

The first vacuum transfer module 200 can be in operational relationship with one or more processing modules (not shown) each operable to perform one or more process operations on a semiconductor substrate therein. An exemplary embodiment of an EFEM 50 in operational relationship with one or FOUPS and one or more processing modules through upper and lower load locks 60, 65 and a vacuum transfer module 200 having one or more robotic systems (i.e. robots) operable to transfer semiconductor substrates therethrough, in what can be called a cluster processing tool, can be found in commonly-assigned U.S. Pat. Nos. 8,430,620, 8,282,698, and 8,562,272, which are hereby incorporated by reference herein in their entirety.

The pressure in the upper and lower load locks 60, 65 can be controlled by a load lock vacuum pump 66 in fluid communication with the upper load lock 60 via an upper load lock valve 60a and with the lower load lock 65 via a lower load lock valve 65a wherein the upper and lower load locks 60, 65 are preferably fluidly isolated from each other. In this manner, the upper load lock 60 can be dedicated to transferring inbound (e.g. unprocessed) substrates from the EFEM 50 to the vacuum transfer module 200 while the lower load lock 65 can be dedicated to transferring outbound (e.g. processed) substrates from the first vacuum transfer module 200 to the EFEM 50. Preferably, the pressure in the first vacuum transfer module 200 can be controlled by a first vacuum pump 205 in fluid communication with the first vacuum transfer module 200 via a first vacuum transfer module valve 200a such that a vacuum environment can be maintained in the first vacuum transfer module 200. The first vacuum transfer module 200 is also preferably in fluid communication with a first vacuum transfer mass flow controller 210 which is operable to supply an inert gas to the interior of the first vacuum transfer module 200.

The first vacuum transfer module 200 can be in operational relationship with a second vacuum transfer module 300 via the buffer station 100. In an embodiment, the buffer station 100 can be supported by a frame 500 which also supports the second vacuum transfer module 300. In alternate embodiments, the buffer station 100 can be supported by a first vacuum transfer module frame 600 which supports the first vacuum transfer module 200, or alternatively the buffer station 100 can be suspended between the first and second vacuum transfer modules 200, 300.

The buffer station 100 interfaces with the first vacuum transfer module 200 and the second vacuum transfer module 300 so as to allow semiconductor substrates to be transferred therebetween. The pressure in the second vacuum transfer module 300 can be controlled by a second vacuum pump 305 in fluid communication with the second vacuum transfer module 300 via a second vacuum transfer module valve 300a such that a vacuum environment can be maintained in the second vacuum transfer module 300. The second vacuum transfer module 300 can optionally be in fluid communication with a second vacuum transfer mass flow controller (not shown) which is operable to supply an inert gas to the interior of the first vacuum transfer module 300. The second vacuum transfer module 300 can be in operational relationship with one or more processing modules 400 each operable to perform one or more process operations on a semiconductor substrate therein.

The buffer station 100 is preferably in fluid communication with an inert gas supply. For example, the inert gas supply can be delivered by a buffer station mass flow controller 111 operable to supply an inert gas such as nitrogen to the buffer chamber 130 of the buffer station 100. The inert gas can facilitate heat transfer between the lower pedestal 140 of the buffer station 100 and a semiconductor substrate supported on the lower pedestal 140 (see FIGS. 1A and 1B). The buffer station 100 is preferably in fluid communication with a vacuum pump which is operable to control the pressure within the buffer chamber 130 thereof. For example, as illustrated in FIG. 2, the buffer station 100 can share the second vacuum pump 305 with the second vacuum transfer module 300. In a further embodiment, a valve 250 can fluidly connect and isolate the vacuum environment (i.e. the buffer chamber 130) of the buffer station 100 with the first vacuum transfer module 200 even when a first slit valve 190 of the buffer station 100 at the first vacuum transfer module interface 110 (see FIGS. 1A and 1B) is in a closed position. In an embodiment, the buffer station 100 can be fluidly connected to a vacuum pump which is distinct from the first and second vacuum pumps 205, 305.

Preferably the first vacuum transfer module 200 interfaces with the buffer station 100 via a first slit valve 190 operable to isolate the environment the buffer chamber 130 from a vacuum environment of the first vacuum transfer module 200. In a further embodiment, the buffer station 100 can interface with the second vacuum transfer module 300 via a second slit valve operable to isolate the environment of the buffer chamber 130 from a vacuum environment of the second vacuum transfer module 300. For example, FIG. 3 illustrates a block diagram of a modular semiconductor substrate processing system 10 including a buffer station 100 according to embodiments disclosed herein wherein a second slit valve 195 is operable to isolate the environment of the buffer chamber 130 from a vacuum environment of the second vacuum transfer module 300.

Figure 3:
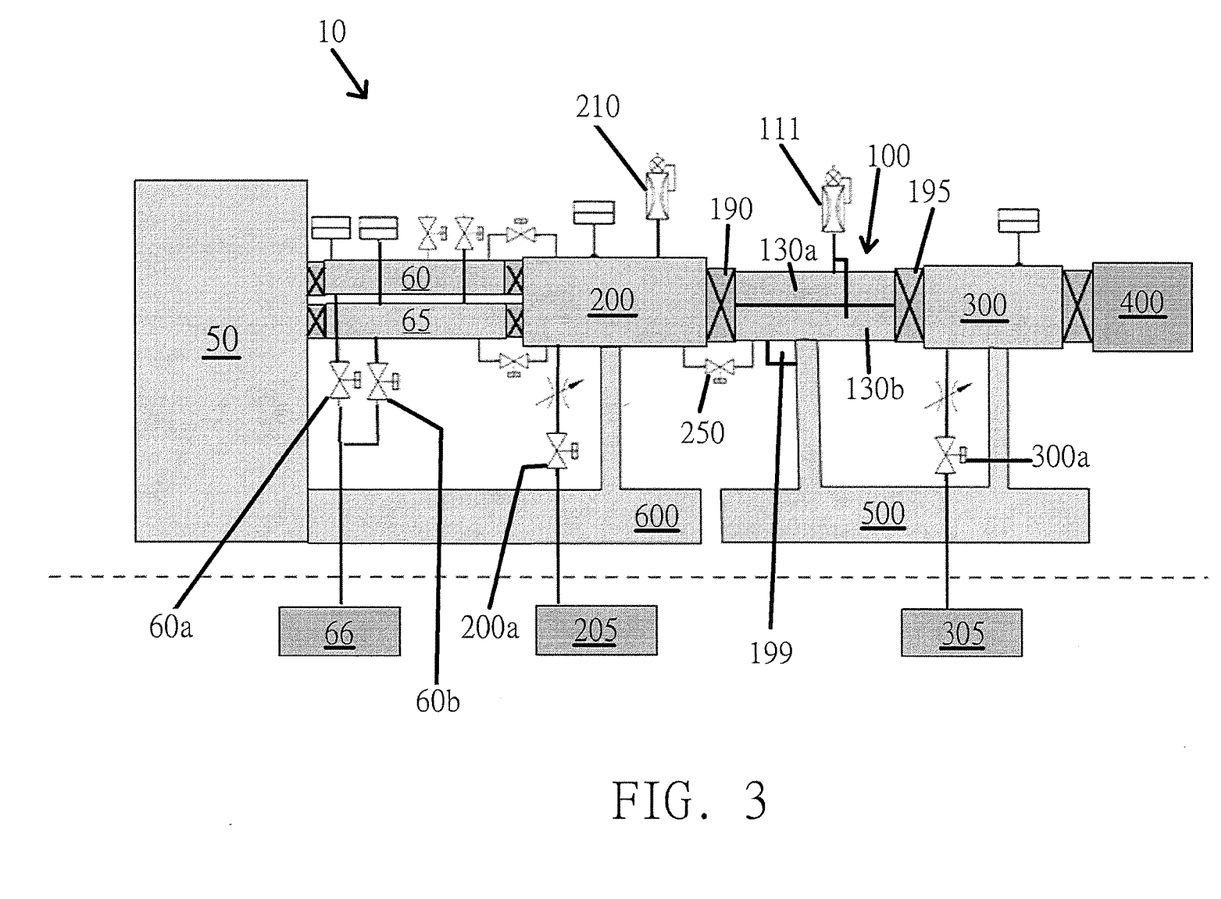
FIG. 3 illustrates a block diagram of a modular semiconductor substrate processing system including a buffer station according to embodiments disclosed herein.

In an embodiment, as illustrated in FIG. 3, the buffer station 100 can include a first buffer chamber 130a disposed above a second buffer chamber 130b. The first buffer chamber 130a is preferably operable to allow semiconductor substrates to be transferred from the first vacuum transfer module 200 to the second vacuum transfer module 300 and the second buffer chamber 130b is operable to allow semiconductor substrates to be transferred from the second vacuum transfer module 300 to the first vacuum transfer module 200 or vice versa. In an embodiment, the respective robots included in the first and/or second vacuum transfer modules 200, 300 may not be able to extend a semiconductor substrate up and down in a vertical direction such that the respective robot can transfer a semiconductor substrate to both a support surface of a lower pedestal in the first buffer chamber 130a and a support surface of a lower pedestal in the second buffer chamber 130b. In this embodiment, a driver 199 is operable to raise and lower the first and second buffer chambers 130a, 130b so as to allow semiconductor substrates to be transferred through the first buffer chamber 130a (when in a lowered position) and to raise the first and second buffer chambers 130a, 130b so as to allow semiconductor substrates to be transferred through the second buffer chamber 130b. In an embodiment, the upper surface of the second buffer chamber 130b can be defined by a lower surface of the lower pedestal of the first buffer chamber 130a.

Referring back to FIGS. 1A and 1B, in an embodiment, the lid 170 of the buffer station 100 can be removable so as to allow access to the buffer chamber 130 of the buffer station 100 such that the buffer station 100 may be serviced. Preferably O-rings disposed in O-ring grooves 188 form seals (e.g. vacuum seals) between a lower surface of the lid 170 and an upper surface of the buffer station 100. Additionally, the lower pedestal 140 may be removable so as to allow the lower pedestal 140 to be repaired or replaced. For example, if a semiconductor substrate processing operation calls for a semiconductor substrate to be processed at high temperatures, such as temperatures greater than 400° C., a lower pedestal having the capability to pre-heat semiconductor substrates to temperatures greater than 400° C. may replace a lower pedestal which does not have such capability, thereby allowing such temperatures to be reached before the semiconductor substrate is transferred by the first or second vacuum transfer module to a respective processing module wherein the process operation is performed at the high temperature. The pre-heating of the semiconductor substrate before the semiconductor substrate is transferred to a respective processing module for processing increases throughput of semiconductor substrates being processed as the time spent heating the semiconductor substrate to the proper processing temperature in the processing module is reduced. Additionally, O-rings disposed in O-ring grooves 189 may form seals (e.g. vacuum seals) between an upper surface of the lower pedestal 140 and a lower surface of the buffer station 100.

Embodiments of buffer stations 100 as disclosed herein can be used to form modular semiconductor substrate processing systems 10. As used herein, modular semiconductor substrate processing systems 10 are semiconductor substrate processing systems having discrete modules which can be arranged and/or rearranged into various configurations depending on semiconductor substrate processing operations to be performed on one or more substrates therein. For example, a modular semiconductor substrate processing system 10 can include two or more vacuum transfer modules 450 or three or more vacuum transfer modules 450 arranged with one or more buffer stations 100 interfacing between the respective vacuum transfer modules 450.

Figure 4A:
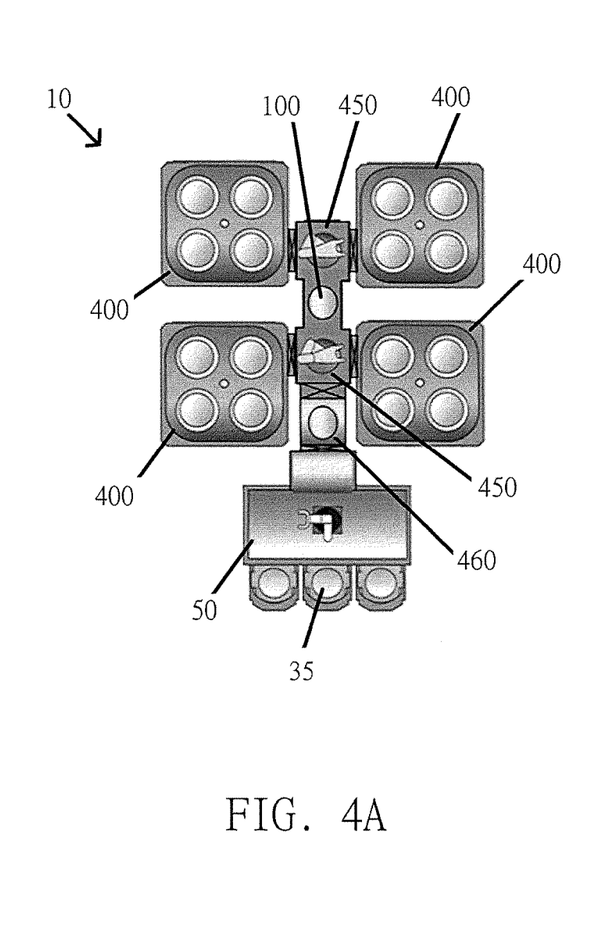
FIG. 4A-G illustrate configurations of modular semiconductor substrate processing system according to embodiments disclosed herein.
Figure 4B:
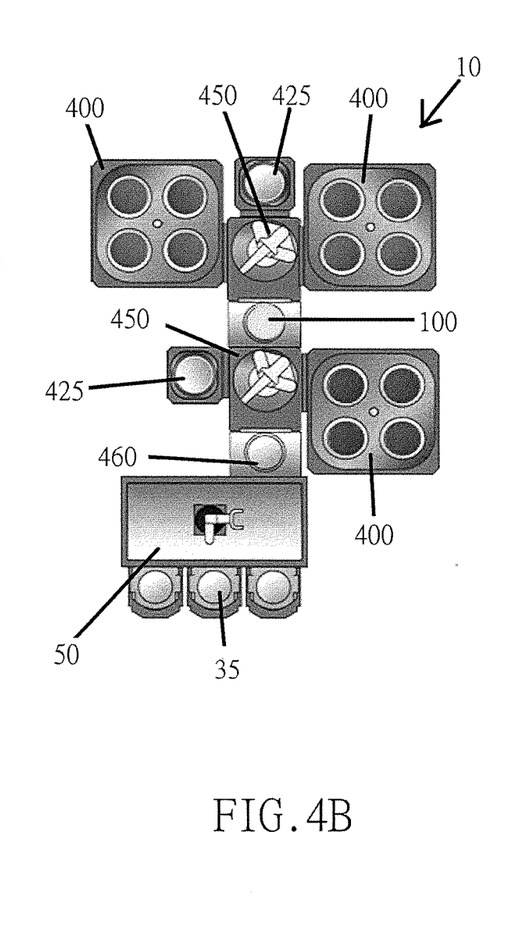
Figure 4C:
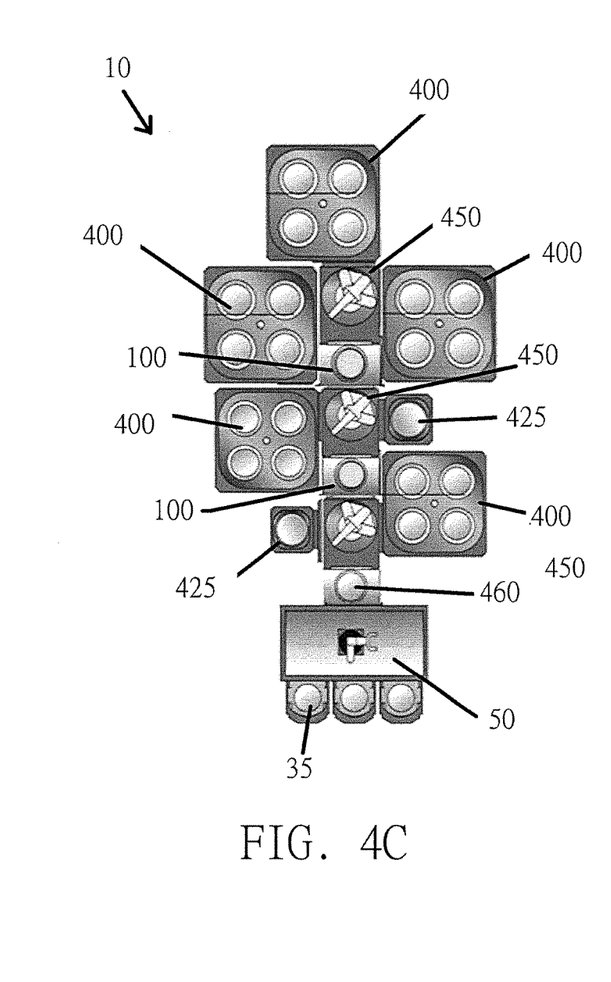
Figure 4D:
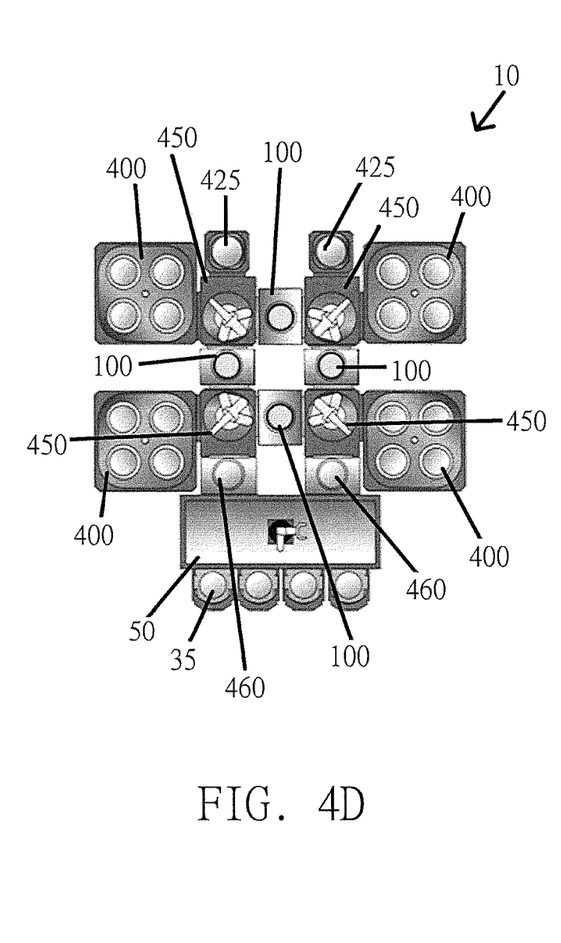
Figure 4E:
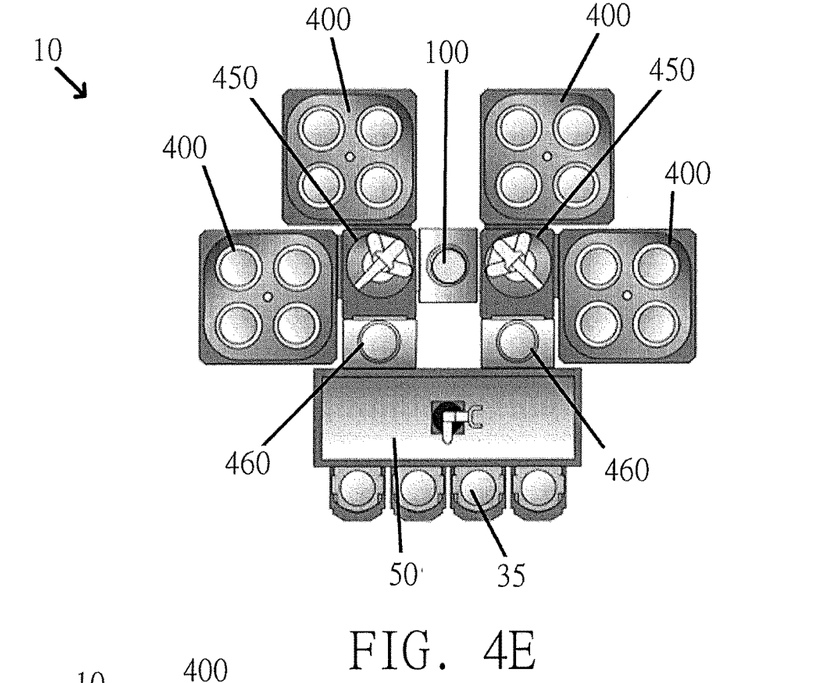
Figure 4F:
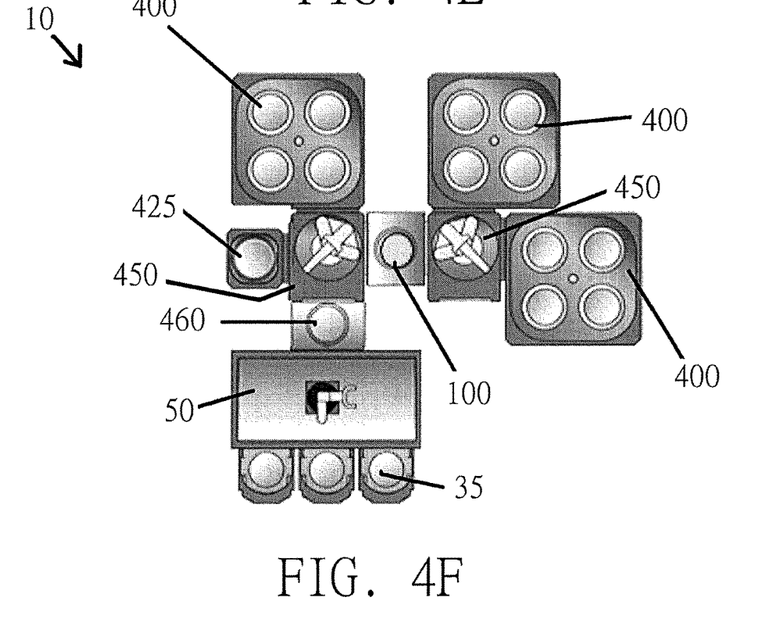
Figure 4G:
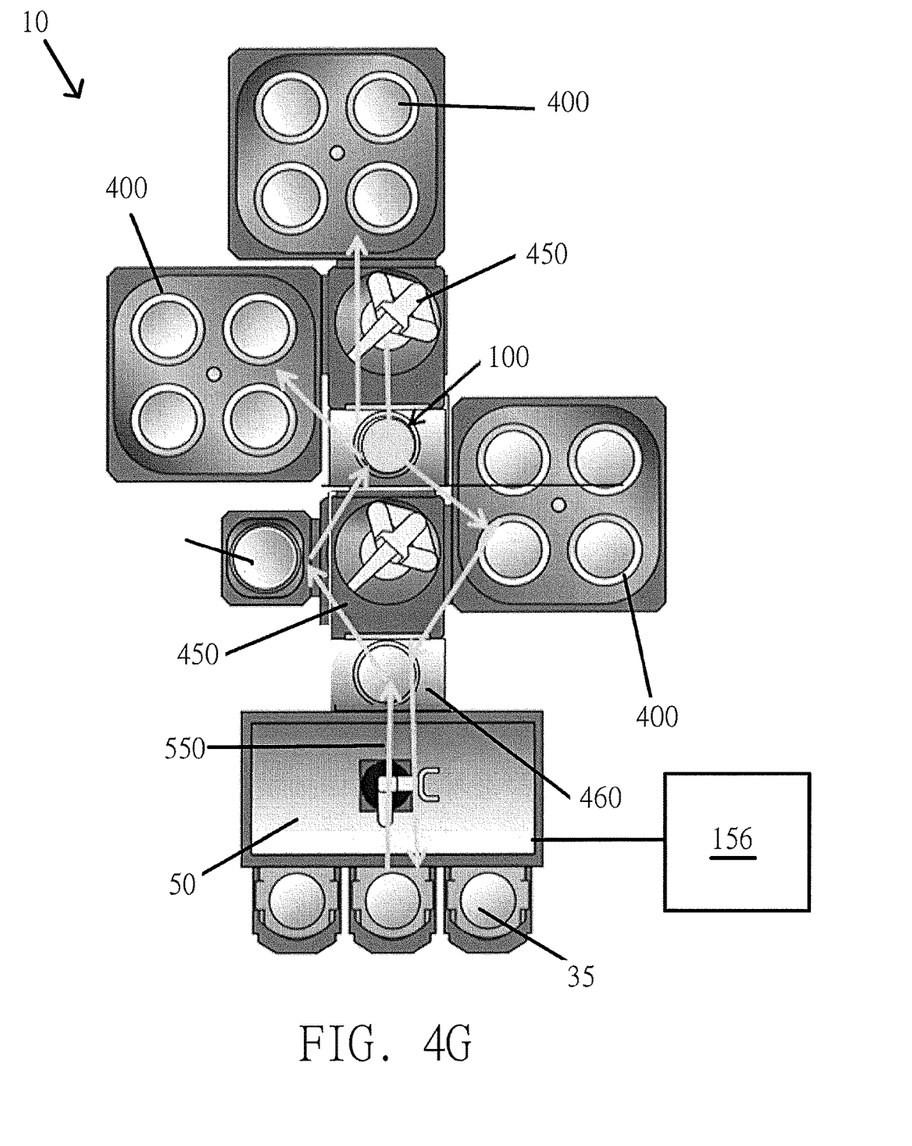

For example, FIGS. 4A-4G illustrate possible configurations for modular semiconductor substrate processing systems 10 each including an EFEM 50 attached to one or more FOUPs 35 for supply semiconductor substrates to the modular semiconductor substrate processing system 10. The modular semiconductor substrate processing systems 10 can include load locks 460 for changing a pressure environment of the semiconductor substrates, and two or more vacuum transfer modules 450 in operational relationship with respective processing modules 400 wherein the vacuum transfer modules 450 are each operable to transfer the semiconductor substrates to the respective processing modules 400. The modular semiconductor substrate processing systems 10 can include one or more buffer stations 100 interfacing between the respective vacuum transfer modules 450 wherein the buffer stations 100 are operable to pre-heat or cool a semiconductor substrate before the substrate is transferred by a vacuum transfer module 450 to a respective processing module 400 or back to the EFEM 50 such that the semiconductor substrate can be stored in a respective FOUP 35 and removed from the modular semiconductor substrate processing system 10. The modular semiconductor substrate processing systems 10 can also include processing modules 425 operable to perform a semiconductor substrate cleaning operation or an in-situ optical critical dimension metrology operation upon a semiconductor substrate during the processing operations. FIG. 4G illustrates the path 550 of a semiconductor substrate through a modular semiconductor substrate processing system 10 according to embodiments disclosed herein.

The processing modules 400 can perform processing operations on semiconductor substrates such semiconductor substrate etching, material deposition, and semiconductor substrate cleaning operations which include operations such as plasma etching, atomic layer etching (ALE), physical vapor deposition (PVD), chemical vapor deposition (CVD), plasma enhanced chemical vapor deposition (PECVD), atomic layer deposition (ALD), plasma enhanced atomic layer deposition (PEALD), pulsed deposition layer (PDL), molecular layer deposition (MLD), plasma enhanced pulsed deposition layer (PEPDL) processing, resist removal, in-situ metrology, dry cleaning, wet semiconductor substrate cleaning, ion beam etching (IBE), and wet-etching (e.g., chemical etch).

The modular semiconductor substrate processing systems 10 and related semiconductor substrate handling systems disclosed herein may be integrated with electronics for controlling their operation before, during, and after processing of a semiconductor wafer or semiconductor substrate. The electronics may be referred to as the "controller," which may control various components or subparts of the system or systems. For example, as illustrated in FIG. 4G the modular semiconductor substrate processing system 10 and/or the EFEM 50 includes an associated controller 156. The controller 156, depending on the processing requirements and/or the type of modular semiconductor substrate processing system 10, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, semiconductor substrate transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a substrate.

The controller 156, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the semiconductor substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller 156 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level (i.e. a modular semiconductor substrate processing system 10) or as part of a remote computer) that combine to control a process on the chamber.

Without limitation, example modular semiconductor substrate processing systems 10 may include processing chambers including a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing apparatuses or systems that may be associated or used in the fabrication and/or manufacturing of semiconductor substrates.

As noted above, depending on the process step or steps to be performed by the modular semiconductor substrate processing system 10, the controller 156 might communicate with one or more of other tool circuits or modules, other tool components, cluster tools, other tool interfaces, adjacent tools, neighboring tools, tools located throughout a factory, a main computer, another controller, or tools used in material transport that bring containers (e.g. FOUPs) of semiconductor substrates to and from tool locations and/or load ports in a semiconductor manufacturing factory. Preferably, a non-transitory computer machine-readable medium includes program instructions for control of the modular semiconductor substrate processing system 10.

A method of transferring semiconductor substrates through a buffer station between a first vacuum transfer module and a second vacuum transfer module of a modular semiconductor substrate processing system can include transferring a semiconductor substrate from a first vacuum transfer module through a first vacuum transfer module interface into a first buffer chamber of the buffer station. The semiconductor substrate can be supported on a support surface of a lower pedestal disposed in the first buffer chamber wherein a heating or cooling operation is performed on the semiconductor substrate supported on the support surface of the lower pedestal. The semiconductor substrate can be then transferred from the lower pedestal of the first buffer chamber through a second vacuum transfer module interface of the buffer station to a second vacuum transfer module, wherein the vacuum transfer module can transfer the semiconductor substrate to a processing module in operational relationship therewith such that a processing operation can be performed on the substrate.

The method can further include storing the semiconductor substrate on a semiconductor substrate storage shelf in the first buffer chamber before the semiconductor substrate is supported on the support surface of the lower pedestal of the buffer chamber, increasing the pressure in the first buffer chamber during the heating or cooling operation so as to increase heat transfer between the support surface of the lower pedestal and the semiconductor substrate, providing an inert gas environment in the first buffer chamber during the heating or cooling operation, isolating the first buffer chamber environment from the first and/or second vacuum transfer modules during the heating or cooling operation, delivering a heat transfer gas to an underside of the semiconductor substrate supported on the support surface during the heating or cooling operation, electrostatically clamping the semiconductor substrate to the support surface of the lower pedestal during the heating or cooling operation, and/or independently controlling and tuning the spatial and temporal temperature of the support surface of the lower pedestal with a heater layer including independently controllable heater zones during the heating or cooling operation, so as to control a subsequent processing operation.

The method can also include transferring the semiconductor substrate from the second vacuum chamber through the second vacuum transfer module interface into the first buffer chamber of the buffer station wherein the semiconductor substrate is supported on the support surface of the lower pedestal disposed in the first buffer chamber. An optional heating or cooling operation can then be performed on the semiconductor substrate supported on the support surface of the lower pedestal, or alternatively, the semiconductor substrate may be stored on a semiconductor substrate storage shelf in the first buffer chamber. The semiconductor substrate may then be transferred from the lower pedestal or storage shelf of the first buffer chamber through the first vacuum transfer module interface of the buffer station to the first vacuum transfer module.

In a further embodiment, the method can include transferring the semiconductor substrate from the second vacuum chamber through the second vacuum transfer module interface into a second buffer chamber of the buffer station. The semiconductor substrate can then be supported on a support surface of a lower pedestal disposed in the second buffer chamber wherein an optional heating or cooling operation may be performed on the semiconductor substrate supported on the support surface of the lower pedestal, or alternatively, the semiconductor substrate may be stored on a semiconductor substrate storage shelf in the second buffer chamber. The semiconductor substrate may then be transferred from the lower pedestal or storage shelf of the second buffer chamber through the first vacuum transfer module interface of the buffer station to the first vacuum transfer module. The substrate may then be transferred through the EFEM to a respective FOUP and removed from the semiconductor substrate processing system.

Moreover, when the words "generally", "relatively", and "substantially" are used in connection with geometric shapes, it is intended that precision of the geometric shape is not required but that latitude for the shape is within the scope of the disclosure. When used with geometric terms, the words "generally", "relatively", and "substantially" are intended to encompass not only features, which meet the strict definitions, but also features, which fairly approximate the strict definitions.

While the plasma processing apparatus including an isothermal deposition chamber has been described in detail with reference to specific embodiments thereof, it will be apparent to those skilled in the art that various changes and modifications can be made, and equivalents employed, without departing from the scope of the appended claims.

What is claimed is:

1. A buffer station for thermal control of semiconductor substrates in a modular semiconductor substrate processing system being transferred therethrough, the buffer station configured to interface with first and second vacuum transfer modules of the modular semiconductor substrate processing system so as to allow semiconductor substrates to be transferred therebetween, the buffer station comprising:
   a first vacuum transfer module interface configured to allow one or more semiconductor substrates to be transferred between the first vacuum transfer module and the buffer station at vacuum pressure;
   a second vacuum transfer module interface configured to allow one or more semiconductor substrates to be transferred between the second vacuum transfer module and the buffer station at vacuum pressure; and
   at least one buffer chamber between the first vacuum transfer module interface and the second vacuum transfer module interface, each of the at least one buffer chambers including a lower pedestal that forms a bottom most interior surface of the buffer chamber, that is configured to receive a semiconductor substrate from the first vacuum transfer module or the second vacuum transfer module on a support surface thereof, and that is operable to perform a heating or cooling operation on the semiconductor substrate received thereon, and one or more semiconductor substrate storage shelves that are located above the lower pedestal, that extend outwardly from a side wall of the buffer chamber, and that are each configured to receive a semiconductor substrate from the first vacuum transfer module or the second vacuum transfer module wherein each semiconductor substrate storage shelf is operable to store a respective semiconductor substrate thereon.

2. The buffer station of claim 1, wherein the lower pedestal includes a heater layer which includes independently controllable heater zones operable to independently control and tune the spatial and temporal temperature of the support surface of the lower pedestal; and/or the lower pedestal includes a cooling layer operable to reduce the temperature of the lower pedestal.

3. The buffer station of claim 1, wherein the at least one buffer chamber includes a heat shield between the lower pedestal and the one or more semiconductor substrate storage shelves wherein the heat shield is operable to reduce heat transfer between a semiconductor substrate supported on the lower pedestal and one or more substrates supported on the respective one or more semiconductor substrate storage shelves during processing.

4. The buffer station of claim 1, wherein:
   (a) the at least one buffer chamber includes a first buffer chamber disposed above a second buffer chamber wherein the first buffer chamber is configured to allow semiconductor substrates to be transferred from the first vacuum transfer module to the second vacuum transfer module and the second buffer chamber is configured to allow semiconductor substrates to be transferred from the second vacuum transfer module to the first vacuum transfer module; or (b) the at least one buffer chamber includes a first buffer chamber disposed above a second buffer chamber wherein the first buffer chamber is configured to allow semiconductor substrates to be transferred from the first vacuum transfer module to the second vacuum transfer module and the second buffer chamber is configured to allow semiconductor substrates to be transferred from the second vacuum transfer module to the first vacuum transfer module wherein the buffer station includes a driver operable to lower the first and second buffer chambers so as to allow semiconductor substrates to be transferred through the first buffer chamber and to raise the first and second buffer chambers so as to allow semiconductor substrates to be transferred through the second buffer chamber.

5. The buffer station of claim 1, wherein:

(a) the buffer station is configured to be in fluid communication with an inert gas supply, the inert gas supply operable to supply inert gas to the at least one buffer chamber so as to facilitate heat transfer between the lower pedestal and a semiconductor substrate supported on the lower pedestal;

(b) the buffer station is configured to be in fluid communication with a vacuum pump, the vacuum pump operable to control the pressure within the at least one buffer chamber;

(c) the first vacuum transfer module interface includes a first slit valve operable to seal a first port of the first vacuum transfer module interface, the first slit valve configured to isolate the environment of the at least one buffer chamber from a vacuum environment of the first vacuum transfer module;

(d) the second vacuum transfer module interface includes a second slit valve operable to seal a first port of the second vacuum transfer module interface, the second slit valve configured to isolate the environment of the at least one buffer chamber from a vacuum environment of the second vacuum transfer module;

(e) the buffer station includes alignment pins configured to align a first port of the first vacuum transfer module interface with a respective port of the first vacuum transfer module; and/or (f) the buffer station includes alignment pins configured to align a first port of the second vacuum transfer module interface with a respective port of the second vacuum transfer module.

6. The buffer station of claim 1, wherein the lower pedestal includes:

(a) at least one outlet in the support surface which delivers a heat transfer gas to an underside of a semiconductor substrate supported thereon, and at least one gas passage extending through the lower pedestal connected to a source of heat transfer gas operable to supply heat transfer gas at a desired pressure to the at least one gas passage;

(b) a monopolar or bipoloar electrostatic clamping electrode operable to apply an electrostatic clamping force to a semiconductor substrate on the support surface when an electrostatic clamping voltage is applied to the monopolar or bipolar electrostatic clamping electrode; and/or (c) lift pins operable to lower a semiconductor substrate onto the support surface of the lower pedestal and to raise the semiconductor substrate from the support surface of the lower pedestal.

7. A modular semiconductor substrate processing system including a buffer station for thermal control of semiconductor substrates being transferred therethrough, the modular semiconductor substrate processing system comprising:

a first vacuum transfer module;

a second vacuum transfer module; and a buffer station interfaced with the first vacuum transfer module and the second vacuum transfer module so as to allow semiconductor substrates to be transferred therebetween, the buffer station comprising:

a first vacuum transfer module interface operable to allow one or more semiconductor substrates to be transferred between the first vacuum transfer module and the buffer station at vacuum pressure;

a second vacuum transfer module interface operable to allow one or more semiconductor substrates to be transferred between the second vacuum transfer module and the buffer station at vacuum pressure; and at least one buffer chamber between the first vacuum transfer module interface and the second vacuum transfer module interface, each of the at least one buffer chambers including a lower pedestal that forms a bottom most interior surface of the buffer chamber, that is operable to receive a semiconductor substrate from the first vacuum transfer module or the second vacuum transfer module on a support surface thereof, and that is operable to perform a heating or cooling operation on the semiconductor substrate received thereon, and one or more semiconductor substrate storage shelves that are located above the lower pedestal, that extend outwardly from a side wall of the buffer chamber, and that are each operable to receive a semiconductor substrate from the first vacuum transfer module or the second vacuum transfer module wherein each semiconductor substrate storage shelf is operable to store a respective semiconductor substrate thereon.

8. The modular semiconductor substrate processing system of claim 7, wherein the lower pedestal includes a heater layer which includes independently controllable heater zones operable to independently control and tune the spatial and temporal temperature of the support surface of the lower pedestal; and/or the lower pedestal includes a cooling layer operable to reduce the temperature of the lower pedestal.

9. The modular semiconductor substrate processing system of claim 7, wherein the at least one buffer chamber includes a heat shield between the lower pedestal and the one or more semiconductor substrate storage shelves wherein the heat shield is operable to reduce heat transfer between a semiconductor substrate supported on the lower pedestal and one or more substrates supported on the respective one or more semiconductor substrate storage shelves during processing.

10. The modular semiconductor substrate processing system of claim 7, wherein:

(a) the at least one buffer chamber includes a first buffer chamber disposed above a second buffer chamber wherein the first buffer chamber is operable to allow semiconductor substrates to be transferred from the first vacuum transfer module to the second vacuum transfer module and the second buffer chamber is operable to allow semiconductor substrates to be transferred from the second vacuum transfer module to the first vacuum transfer module; or (b) the at least one buffer chamber includes a first buffer chamber disposed above a second buffer chamber wherein the first buffer chamber is operable to allow semiconductor substrates to be transferred from the first vacuum transfer module to the second vacuum transfer module and the second buffer chamber is operable to allow semiconductor substrates to be transferred from the second vacuum transfer module to the first vacuum transfer module wherein the buffer station includes a driver operable to lower the first and second buffer chambers so as to allow semiconductor substrates to be transferred through the first buffer chamber and to raise the first and second buffer chambers so as to allow semiconductor substrates to be transferred through the second buffer chamber.

11. The modular semiconductor substrate processing system of claim 7, wherein:
   (a) the buffer station is in fluid communication with an inert gas supply, the inert gas supply operable to supply inert gas to the at least one buffer chamber so as to facilitate heat transfer between the lower pedestal and a semiconductor substrate supported on the lower pedestal;
   (b) the buffer station is in fluid communication with a vacuum pump, the vacuum pump operable to control the pressure within the at least one buffer chamber;
   (c) the first vacuum transfer module interface includes a first slit valve operable to seal a first port of the first vacuum transfer module interface, the first slit valve operable to isolate the environment of the at least one buffer chamber from a vacuum environment of the first vacuum transfer module;
   (d) the second vacuum transfer module interface includes a second slit valve operable to seal a first port of the second vacuum transfer module interface, the second slit valve operable to isolate the environment of the at least one buffer chamber from a vacuum environment of the second vacuum transfer module;
   (d) the buffer station includes alignment pins operable to align a first port of the first vacuum transfer module interface with a respective port of the first vacuum transfer module;
   (e) the buffer station includes alignment pins operable to align a first port of the second vacuum transfer module interface with a respective port of the second vacuum transfer module;
   (f) the modular semiconductor substrate processing system further comprises a controller configured to control processes performed by the system; and/or
   (g) the modular semiconductor substrate processing system further comprises a non-transitory computer machine-readable medium comprising program instructions for control of the system.

12. The modular semiconductor substrate processing system of claim 7, wherein the lower pedestal includes:
   (a) at least one outlet in the support surface which delivers a heat transfer gas to an underside of a semiconductor substrate supported thereon, and at least one gas passage extending through the lower pedestal connected to a source of heat transfer gas operable to supply heat transfer gas at a desired pressure to the at least one gas passage;
   (b) a monopolar or bipoloar electrostatic clamping electrode operable to apply an electrostatic clamping force to a semiconductor substrate on the support surface when an electrostatic clamping voltage is applied to the monopolar or bipolar electrostatic clamping electrode; and/or
   (c) lift pins operable to lower a semiconductor substrate onto the support surface of the lower pedestal and to raise the semiconductor substrate from the support surface of the lower pedestal.

13. The modular semiconductor substrate processing system of claim 7, wherein
   (a) the first vacuum transfer module is in operational relationship with an equipment front end module (EFEM), the EFEM operable to receive semiconductor substrates at atmospheric pressure from a front opening unified pod (FOUP) and transfer the semiconductor substrates to a vacuum environment of the first vacuum transfer module;
   (b) the first vacuum transfer module is in operational relationship with one or more semiconductor substrate processing modules operable to perform one or more processing operations on a semiconductor substrate;
   (c) the second vacuum transfer module is in operational relationship with one or more semiconductor substrate processing modules operable to perform one or more processing operations on a semiconductor substrate;
   (d) the first vacuum transfer module includes a robot in a vacuum environment thereof operable to transfer semiconductor substrates through the first vacuum transfer module interface; and/or
   (e) the second vacuum transfer module includes a robot in a vacuum environment thereof operable to transfer semiconductor substrates through the second vacuum transfer module interface.

14. The modular semiconductor substrate processing system of claim 7, wherein:
   (a) the buffer station is supported by a frame of the first or second vacuum transfer modules; or
   (b) the buffer station is suspended between the first and second vacuum transfer modules.

15. A modular semiconductor substrate processing system comprising three or more vacuum transfer modules, each vacuum transfer module in operational relationship with at least one other vacuum transfer module by the buffer station of claim 1.

16. The modular semiconductor substrate processing system of claim 15, wherein:
   (a) at least one of the vacuum transfer modules is in operational relationship with an EFEM operable to receive semiconductor substrates at atmospheric pressure from a front opening unified pod (FOUP) and transfer the semiconductor substrates to a vacuum environment thereof; and/or
   (b) each vacuum transfer module is in operational relationship with one or more semiconductor substrate processing modules operable to perform one or more processing operations on a semiconductor substrate.

17. A method of transferring semiconductor substrates through a buffer station between a first vacuum transfer module and a second vacuum transfer module of a modular semiconductor substrate processing system, the method comprising:
   transferring a semiconductor substrate from a first vacuum transfer module through a first vacuum transfer module interface into a first buffer chamber of the buffer station;
   supporting the semiconductor substrate on a support surface of a lower pedestal disposed in the first buffer chamber and forming a bottom most interior surface of the buffer chamber;

performing a heating or cooling operation on the semiconductor substrate supported on the support surface of the lower pedestal; and transferring the semiconductor substrate from the lower pedestal of the first buffer chamber through a second vacuum transfer module interface of the buffer station to a second vacuum transfer module; and storing the semiconductor substrate on a semiconductor substrate storage shelf in the first buffer chamber before the semiconductor substrate is supported on the support surface of the lower pedestal of the buffer chamber, the semiconductor storage shelf being located above the lower pedestal and extending outwardly from a side wall of the first buffer chamber.

18. The method of claim 17, and
(a) increasing the pressure in the first buffer chamber during the heating or cooling operation so as to increase heat transfer between the support surface of the lower pedestal and the semiconductor substrate;
(b) providing an inert gas environment in the first buffer chamber during the heating or cooling operation;
(c) isolating the first buffer chamber environment from the first and/or second vacuum transfer modules during the heating or cooling operation;
(d) delivering a heat transfer gas to an underside of the semiconductor substrate supported on the support surface during the heating or cooling operation;
(e) electrostatically clamping the semiconductor substrate to the support surface of the lower pedestal during the heating or cooling operation; and/or
(f) independently controlling and tuning the spatial and temporal temperature of the support surface of the lower pedestal with a heater layer including independently controllable heater zones during the heating or cooling operation.

19. The method of claim 17, further comprising:
transferring the semiconductor substrate from the second vacuum chamber through the second vacuum transfer module interface into the first buffer chamber of the buffer station; and
supporting the semiconductor substrate on the support surface of the lower pedestal disposed in the first buffer chamber and performing one of:
a heating or cooling operation on the semiconductor substrate supported on the support surface of the lower pedestal; and
storing the semiconductor substrate on a second semiconductor substrate storage shelf in the first buffer chamber; and
transferring the semiconductor substrate from the first buffer chamber through the first vacuum transfer module interface of the buffer station to the first vacuum transfer module.

20. The method of claim 17, further comprising;
transferring the semiconductor substrate from the second vacuum chamber through the second vacuum transfer module interface into a second buffer chamber of the buffer station;
supporting the semiconductor substrate on a support surface of a lower pedestal disposed in the second buffer chamber and performing one of:
a heating or cooling operation on the semiconductor substrate supported on the support surface of the lower pedestal; and
storing the semiconductor substrate on a second semiconductor substrate storage shelf in the second buffer chamber; and transferring the semiconductor substrate from the second buffer chamber through the first vacuum transfer module interface of the buffer station to the first vacuum transfer module.

21. A buffer station for thermal control of semiconductor substrates in a modular semiconductor substrate processing system being transferred therethrough, the buffer station configured to interface with first and second vacuum transfer modules of the modular semiconductor substrate processing system so as to allow semiconductor substrates to be transferred therebetween, the buffer station comprising:
a first vacuum transfer module interface configured to allow one or more semiconductor substrates to be transferred between the first vacuum transfer module and the buffer station at vacuum pressure;
a second vacuum transfer module interface configured to allow one or more semiconductor substrates to be transferred between the second vacuum transfer module and the buffer station at vacuum pressure; and
at least one buffer chamber between the first vacuum transfer module interface and the second vacuum transfer module interface, the at least one buffer chamber including a lower pedestal configured to receive a semiconductor substrate from the first vacuum transfer module or the second vacuum transfer module on a support surface thereof and operable to perform a heating or cooling operation on the semiconductor substrate received thereon, and one or more semiconductor substrate storage shelves above the lower pedestal which are each configured to receive a semiconductor substrate from the first vacuum transfer module or the second vacuum transfer module wherein each semiconductor substrate storage shelf is operable to store a respective semiconductor substrate thereon
wherein at least one of:
(a) the buffer station is configured to be in fluid communication with an inert gas supply, the inert gas supply operable to supply inert gas to the at least one buffer chamber so as to facilitate heat transfer between the lower pedestal and a semiconductor substrate supported on the lower pedestal;
(b) the buffer station is configured to be in fluid communication with a vacuum pump, the vacuum pump operable to control the pressure within the at least one buffer chamber;
(c) the first vacuum transfer module interface includes a first slit valve operable to seal a first port of the first vacuum transfer module interface, the first slit valve configured to isolate the environment of the at least one buffer chamber from a vacuum environment of the first vacuum transfer module;
(d) the second vacuum transfer module interface includes a second slit valve operable to seal a first port of the second vacuum transfer module interface, the second slit valve configured to isolate the environment of the at least one buffer chamber from a vacuum environment of the second vacuum transfer module;
(e) the buffer station includes alignment pins configured to align a first port of the first vacuum transfer module interface with a respective port of the first vacuum transfer module; and
(f) the buffer station includes alignment pins configured to align a first port of the second vacuum transfer module interface with a respective port of the second vacuum transfer module.

22. A buffer station for thermal control of semiconductor substrates in a modular semiconductor substrate processing system being transferred therethrough, the buffer station configured to interface with first and second vacuum transfer modules of the modular semiconductor substrate processing system so as to allow semiconductor substrates to be transferred therebetween, the buffer station comprising:
- a first vacuum transfer module interface configured to allow one or more semiconductor substrates to be transferred between the first vacuum transfer module and the buffer station at vacuum pressure;
- a second vacuum transfer module interface configured to allow one or more semiconductor substrates to be transferred between the second vacuum transfer module and the buffer station at vacuum pressure; and
- at least one buffer chamber between the first vacuum transfer module interface and the second vacuum transfer module interface, the at least one buffer chamber including a lower pedestal configured to receive a semiconductor substrate from the first vacuum transfer module or the second vacuum transfer module on a support surface thereof and operable to perform a heating or cooling operation on the semiconductor substrate received thereon, and one or more semiconductor substrate storage shelves above the lower pedestal which are each configured to receive a semiconductor substrate from the first vacuum transfer module or the second vacuum transfer module wherein each semiconductor substrate storage shelf is operable to store a respective semiconductor substrate thereon, wherein the lower pedestal includes at least one of:
  (a) at least one outlet in the support surface which delivers a heat transfer gas to an underside of a semiconductor substrate supported thereon, and at least one gas passage extending through the lower pedestal connected to a source of heat transfer gas operable to supply heat transfer gas at a desired pressure to the at least one gas passage;
  (b) a monopolar or bipolar electrostatic clamping electrode operable to apply an electrostatic clamping force to a semiconductor substrate on the support surface when an electrostatic clamping voltage is applied to the monopolar or bipolar electrostatic clamping electrode; and
  (c) lift pins operable to lower a semiconductor substrate onto the support surface of the lower pedestal and to raise the semiconductor substrate from the support surface of the lower pedestal.

23. A modular semiconductor substrate processing system including a buffer station for thermal control of semiconductor substrates being transferred therethrough, the modular semiconductor substrate processing system comprising:
- a first vacuum transfer module;
- a second vacuum transfer module; and
- a buffer station interfaced with the first vacuum transfer module and the second vacuum transfer module so as to allow semiconductor substrates to be transferred therebetween, the buffer station comprising:
  a first vacuum transfer module interface operable to allow one or more semiconductor substrates to be transferred between the first vacuum transfer module and the buffer station at vacuum pressure;
  a second vacuum transfer module interface operable to allow one or more semiconductor substrates to be transferred between the second vacuum transfer module and the buffer station at vacuum pressure; and
  at least one buffer chamber between the first vacuum transfer module interface and the second vacuum transfer module interface, the at least one buffer chamber including a lower pedestal operable to receive a semiconductor substrate from the first vacuum transfer module or the second vacuum transfer module on a support surface thereof and operable to perform a heating or cooling operation on the semiconductor substrate received thereon, and one or more semiconductor substrate storage shelves above the lower pedestal which are each operable to receive a semiconductor substrate from the first vacuum transfer module or the second vacuum transfer module wherein each semiconductor substrate storage shelf is operable to store a respective semiconductor substrate thereon, wherein at least one of:
  (a) the buffer station is in fluid communication with an inert gas supply, the inert gas supply operable to supply inert gas to the at least one buffer chamber so as to facilitate heat transfer between the lower pedestal and a semiconductor substrate supported on the lower pedestal;
  (b) the buffer station is in fluid communication with a vacuum pump, the vacuum pump operable to control the pressure within the at least one buffer chamber;
  (c) the first vacuum transfer module interface includes a first slit valve operable to seal a first port of the first vacuum transfer module interface, the first slit valve operable to isolate the environment of the at least one buffer chamber from a vacuum environment of the first vacuum transfer module;
  (d) the second vacuum transfer module interface includes a second slit valve operable to seal a first port of the second vacuum transfer module interface, the second slit valve operable to isolate the environment of the at least one buffer chamber from a vacuum environment of the second vacuum transfer module;
  (d) the buffer station includes alignment pins operable to align a first port of the first vacuum transfer module interface with a respective port of the first vacuum transfer module;
  (e) the buffer station includes alignment pins operable to align a first port of the second vacuum transfer module interface with a respective port of the second vacuum transfer module;
  (f) modular semiconductor substrate processing system includes a controller configured to control processes performed by the system; and
  (g) modular semiconductor substrate processing system includes a non-transitory computer machine-readable medium comprising program instructions for control of the system.

24. A modular semiconductor substrate processing system including a buffer station for thermal control of semiconductor substrates being transferred therethrough, the modular semiconductor substrate processing system comprising:
- a first vacuum transfer module;
- a second vacuum transfer module; and
- a buffer station interfaced with the first vacuum transfer module and the second vacuum transfer module so as to allow semiconductor substrates to be transferred therebetween, the buffer station comprising:
  a first vacuum transfer module interface operable to allow one or more semiconductor substrates to be transferred between the first vacuum transfer module and the buffer station at vacuum pressure;

a second vacuum transfer module interface operable to allow one or more semiconductor substrates to be transferred between the second vacuum transfer module and the buffer station at vacuum pressure; and at least one buffer chamber between the first vacuum transfer module interface and the second vacuum transfer module interface, the at least one buffer chamber including a lower pedestal operable to receive a semiconductor substrate from the first vacuum transfer module or the second vacuum transfer module on a support surface thereof and operable to perform a heating or cooling operation on the semiconductor substrate received thereon, and one or more semiconductor substrate storage shelves above the lower pedestal which are each operable to receive a semiconductor substrate from the first vacuum transfer module or the second vacuum transfer module wherein each semiconductor substrate storage shelf is operable to store a respective semiconductor substrate thereon, wherein the lower pedestal includes at least one of:
  (a) at least one outlet in the support surface which delivers a heat transfer gas to an underside of a semiconductor substrate supported thereon, and at least one gas passage extending through the lower pedestal connected to a source of heat transfer gas operable to supply heat transfer gas at a desired pressure to the at least one gas passage;
  (b) a monopolar or bipolar electrostatic clamping electrode operable to apply an electrostatic clamping force to a semiconductor substrate on the support surface when an electrostatic clamping voltage is applied to the monopolar or bipolar electrostatic clamping electrode; and
  (c) lift pins operable to lower a semiconductor substrate onto the support surface of the lower pedestal and to raise the semiconductor substrate from the support surface of the lower pedestal.

25. A method of transferring semiconductor substrates through a buffer station between a first vacuum transfer module and a second vacuum transfer module of a modular semiconductor substrate processing system, the method comprising:

transferring a semiconductor substrate from a first vacuum transfer module through a first vacuum transfer module interface into a first buffer chamber of the buffer station;

supporting the semiconductor substrate on a support surface of a lower pedestal disposed in the first buffer chamber;

performing a heating or cooling operation on the semiconductor substrate supported on the support surface of the lower pedestal;

transferring the semiconductor substrate from the lower pedestal of the first buffer chamber through a second vacuum transfer module interface of the buffer station to a second vacuum transfer module; and at least one of:
  (a) storing the semiconductor substrate on a semiconductor substrate storage shelf in the first buffer chamber before the semiconductor substrate is supported on the support surface of the lower pedestal of the buffer chamber;
  (b) increasing the pressure in the first buffer chamber during the heating or cooling operation so as to increase heat transfer between the support surface of the lower pedestal and the semiconductor substrate;
  (c) providing an inert gas environment in the first buffer chamber during the heating or cooling operation;
  (d) isolating the first buffer chamber environment from the first and/or second vacuum transfer modules during the heating or cooling operation;
  (e) delivering a heat transfer gas to an underside of the semiconductor substrate supported on the support surface during the heating or cooling operation;
  (f) electrostatically clamping the semiconductor substrate to the support surface of the lower pedestal during the heating or cooling operation; and
  (g) independently controlling and tuning the spatial and temporal temperature of the support surface of the lower pedestal with a heater layer including independently controllable heater zones during the heating or cooling operation.

* * * * *